(12) United States Patent
Kindt et al.

(10) Patent No.: US 6,998,907 B1
(45) Date of Patent: Feb. 14, 2006

(54) APPARATUS AND METHOD FOR RECEIVING HIGH-COMMON MODE VOLTAGE RANGE SIGNALS WITH LOW-VOLTAGE DEVICES

(75) Inventors: Willem J. Kindt, Santa Clara, CA (US); Gertjan V. Sprakelaar, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/847,103

(22) Filed: May 17, 2004

(51) Int. Cl.
*H03F 3/45* (2006.01)
*G06G 7/12* (2006.01)

(52) U.S. Cl. .................. 327/563; 330/253; 330/300

(58) Field of Classification Search ........... 327/52, 327/82, 85, 89, 432, 560–563; 330/252–253, 330/258, 300
See application file for complete search history.

(56) References Cited

U.S. PATENT DOCUMENTS

| | | | | |
|---|---|---|---|---|
| 4,897,612 A | | 1/1990 | Carroll | 330/255 |
| 5,587,687 A | * | 12/1996 | Adams | 330/253 |
| 6,563,382 B1 | * | 5/2003 | Yang | 330/254 |
| 6,924,701 B1 | * | 8/2005 | Bhandari | 330/252 |

* cited by examiner

*Primary Examiner*—My-Trang Nu Ton
(74) *Attorney, Agent, or Firm*—Darby & Darby PC; Matthew M. Gaffney

(57) ABSTRACT

An input stage employs low-voltage MOSFETs as input devices for an operational amplifier circuit that operates at common mode voltages that may exceed the gate-oxide breakdown voltage of the input devices. Also, the input stage is arranged for relatively low noise. The input stage is arranged to detect the input common mode voltage and to feed back the detected input common mode voltage to a base of a bipolar folded cascode transistor that is coupled to the drain of the input devices. Accordingly, the input devices are bootstrapped such that they are protected from gate-oxide breakdown.

27 Claims, 9 Drawing Sheets

APPARATUS AND METHOD FOR RECEIVING HIGH-COMMON MODE VOLTAGE RANGE SIGNALS WITH LOW-VOLTAGE DEVICES

FIELD OF THE INVENTION

The invention is related operational amplifiers, and in particular an apparatus and method for receiving high-common mode voltage range signals with low-voltage devices.

BACKGROUND OF THE INVENTION

An operational amplifier may be arranged to receive input signals from bipolar devices. The input signals may operate at relatively high voltages, typically 12V or 24V. Accordingly, the operational amplifier may use bipolar transistors in the input stage in order to receive the input signals. However, in some applications, it may be advantageous to use low-voltage MOSFET (metal oxide semiconductor field-effect transistor) devices in the input stage, rather than bipolar transistors.

However, low-voltage MOSFET devices typically operate at 5V or 3.3V. If the operating voltage of a low-voltage MOSFET device is exceeded, this may result in gate-oxide breakdown and cause damage to the MOSFET device.

BRIEF DESCRIPTION OF THE DRAWINGS

Non-limiting and non-exhaustive embodiments of the present invention are described with reference to the following drawings, in which.

DETAILED DESCRIPTION

Figure 1:
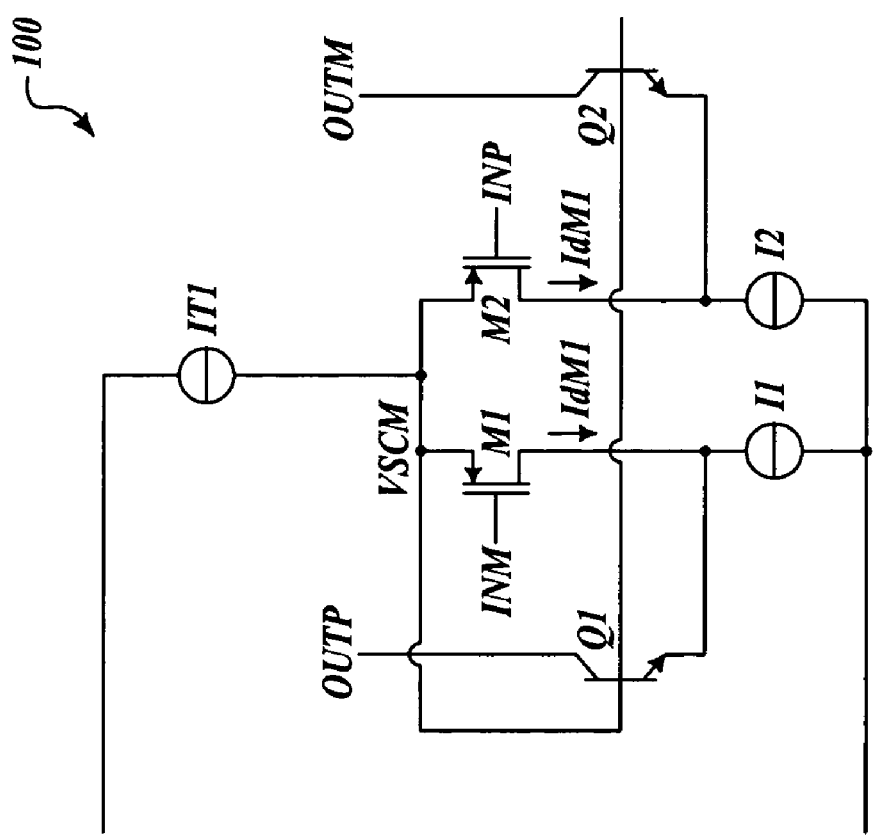
FIG. 1 shows a schematic diagram of an embodiment of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, an input stage employs low-voltage MOSFETs as input devices for an operational amplifier circuit that operates at common mode voltages that may exceed the gate-oxide breakdown voltage of the input devices. Also, the input stage is arranged for relatively low noise. The input stage is arranged to detect the input common mode voltage and to feed back the detected input common mode voltage to a base of a bipolar folded cascode transistor that is coupled to the drain of the input devices. Accordingly, the input devices are bootstrapped such that they are protected from gate-oxide breakdown.

FIG. 1 shows a schematic diagram of an embodiment of circuit 100. Circuit 100 includes components such as transistors M1, M2, Q1, and Q2, and current source circuits I1, I2, and $I_{T1}$.

Transistors M1 and M2 may be low-voltage transistors such as MOSFETs, junction field-effect transistors (JFETs), superbeta bipolar junction transistors, and the like. For example, transistors M1 and M2 may operate at 5 V, 3.3V, and the like. However, circuit 100 is arranged to be employed as the input stage of an operational amplifier that operates at a voltage significantly higher than 5V, without exceeding the gate-oxide breakdown voltage of transistors M1 and M2.

Transistors M1 and M2 are arranged to operate as a differential pair. Additionally, current source circuits I1 and I2 are arranged to operate as active load circuits. The differential pair and current source $I_{T1}$ are arranged to operate as a transconductance stage. The transconductance stage is arranged to receive differential input signal IN, which includes signals INM and INP, at the gates of transistors M1 and M2.

Also, the transconductance stage is arranged to provide a differential current in response to differential input signal IN. The differential current includes currents $I_{dM1}$ and $I_{dM2}$. Based on Kirchhoffs Current Law, the current provided to the emitter of transistor Q1 is $I_{dM1}$-I1, and the current of provided to the emitter of transistor Q2 is $I_{dM2}$-I2.

Differential output signal OUT is the output signal of the folded cascode stage, and differential output signal OUT includes signals OUTP and OUTM. Transistors Q1 and Q2 may be bipolar junction transistors (BJTs). Also, transistor Q1 is configured to provide signal OUTP from the current provided at the emitter of transistor Q1. Similarly, transistor Q2 is configured to provide signal OUTM from the current provided at the emitter of transistor Q2. Signal OUT may be received by the next stage of the operational amplifier, such that the output signal provided by the operational amplifier is based on signal OUT.

Additionally, the differential pair (formed by transistors M1 and M2) is arranged to detect the input common mode voltage. Also, the differential pair is arranged to provide signal $V_{SCM}$ at the source of transistors M1 and M2. Signal $V_{SCM}$ is substantially equal to the input common mode voltage, plus the threshold voltage associated with transistors M1 and M2. Further, the source of transistors M1 and M2 is coupled to the base of transistors Q1 and Q2. Accordingly, transistors Q1 and Q2 are arranged such that the base of transistors Q1 and Q2 receive a signal that is based, in part, on signal $V_{SCM}$.

In one embodiment, the source of transistor M1 is directly connected to the base of transistor Q1. In this embodiment, the base of transistor Q1 is arranged to receive signal $V_{SCM}$ directly. In other embodiments, the source of transistor M1 may be coupled to the base of transistor Q1 through one or more intermediary devices. For example, in one embodiment, as will described in more detail below with reference to FIG. 2, the source of transistor M1 is coupled to the base of transistor Q1 through a level-shift circuit. In another embodiment, as will described in more detail below with reference to FIG. 3, the source of transistor M1 is coupled to the base of transistor Q1 through a rail-sensing circuit. In any event, the base of transistor Q1 receives a signal that is based on signal VSCM.

Further, transistors Q1 and Q2 are arranged such that the base voltage associated with transistors Q1 and Q2 substantially tracks the input common mode voltage, and such that the emitters of transistors Q1 and Q2 follow the base voltage associated with transistors Q1 and Q2. Therefore, in the embodiment illustrated in FIG. 2, for both transistor M1 and transistor M2, the drain voltage may be one Vbe below the source voltage. Accordingly, in this embodiment, the gate-to-drain voltage for both transistor M1 and transistor M2 is substantially zero volts. This may protect transistors M1 and M2 against gate-oxide breakdown if the operational amplifier is operating in closed loop operation.

Currents source circuits I1 and I2 are each arranged to provide a current that is relatively independent of the voltage that is applied across it. Since the voltage at the emitters of transistors Q1 and Q2 each track changes in the input common mode voltage, the voltage across current source circuits I1 and I2 vary with changes in the input common mode voltage.

Circuit 100 may also be protected against large input differential voltages that may occur if the operational amplifier operates in open loop. In one embodiment, circuit 100 further includes two antiparallel diodes coupled between the gates of transistors M1 and M2 to protect circuit 100 when the operational amplifier operates in an open loop.

Transistors M1 and M2 dominate the input noise voltage of circuit 100. As is common for cascode devices, transistors Q1 and Q2 hardly contribute to input noise. Circuit 100 is arranged for relatively low noise, relatively low offset, and relatively low input capacitance. The input capacitance is relatively low because the voltage between the gate and the drain of transistors M1 and M2 are each relatively constant regardless of changes to the input common mode voltage.

In one embodiment, as illustrated in FIG. 1, transistors M1 and M2 are p-type transistors, and current source circuit I1 and I2 are coupled to a negative rail (e.g. ground (GND)). In another embodiment, transistors M1 and M2 are n-type transistors, and current source circuits I1 and I2 are coupled to a positive rail (e.g. VDD).

In an embodiment of circuit 100 in which the source of transistor M1 is directly connected to the base of transistor Q1, circuit 100 can operate at input common mode voltages almost equal to the negative rail (or the positive rail, if M1 and M2 are p-type transistors). However, in this embodiment, it is difficult to guarantee operation at the negative rail (or the positive rail, if M1 and M2 are n-type transistors) for all process corners and temperatures. Also, in this embodiment, at zero input common mode voltage, the voltage at the drain of transistors M1 and M2 substantially equals substantially Vth–Vbe, which is very close to GND. Accordingly, current source circuits I1 and I2 are preferably configured to operate with a very small compliance voltage.

In other embodiments, additional circuitry may be coupled between the base of transistor Q1 and the source of transistor M1, to improve operation near the negative rail (or the positive rail), as will be explained in further detail below.

Figure 2:
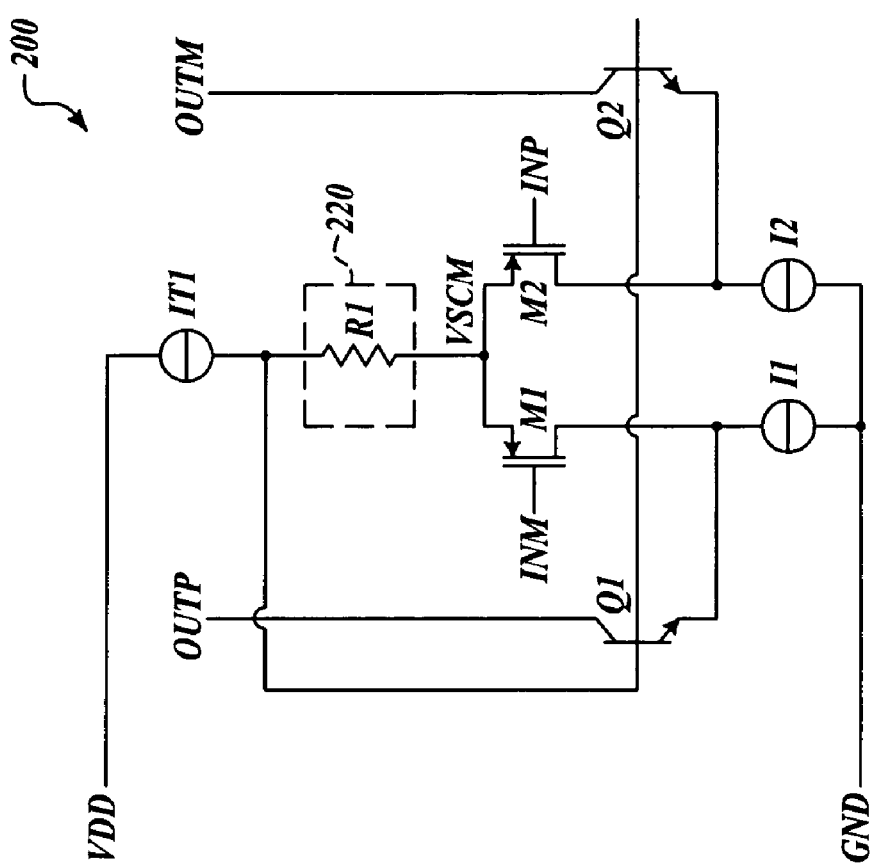
FIG. 2 illustrates a schematic diagram of an embodiment the circuit of FIG. 1 that includes a level shift circuit.

FIG. 2 illustrates a schematic diagram of an embodiment of circuit 200, which includes a level-shift circuit. Components in circuit 200 may operate in a similar manner as similarly-named component in circuit 100 of FIG. 1, and may operate in a different manner in some ways. Circuit 200 further includes level-shift circuit 220. In one embodiment, level-shift circuit 220 includes resistor R1.

Level-shift circuit 220 is arranged to cause a small voltage drop between the base of transistors Q1 and Q2 and the source of transistors M1 and M2. The voltage drop may ensure that there is enough "headroom" for current source circuits I1 and I2 to function properly, even if the input common mode voltage is at or relatively near GND (or VDD, for an embodiment in which transistors M1 and M2 are n-type transistors).

Figure 3:
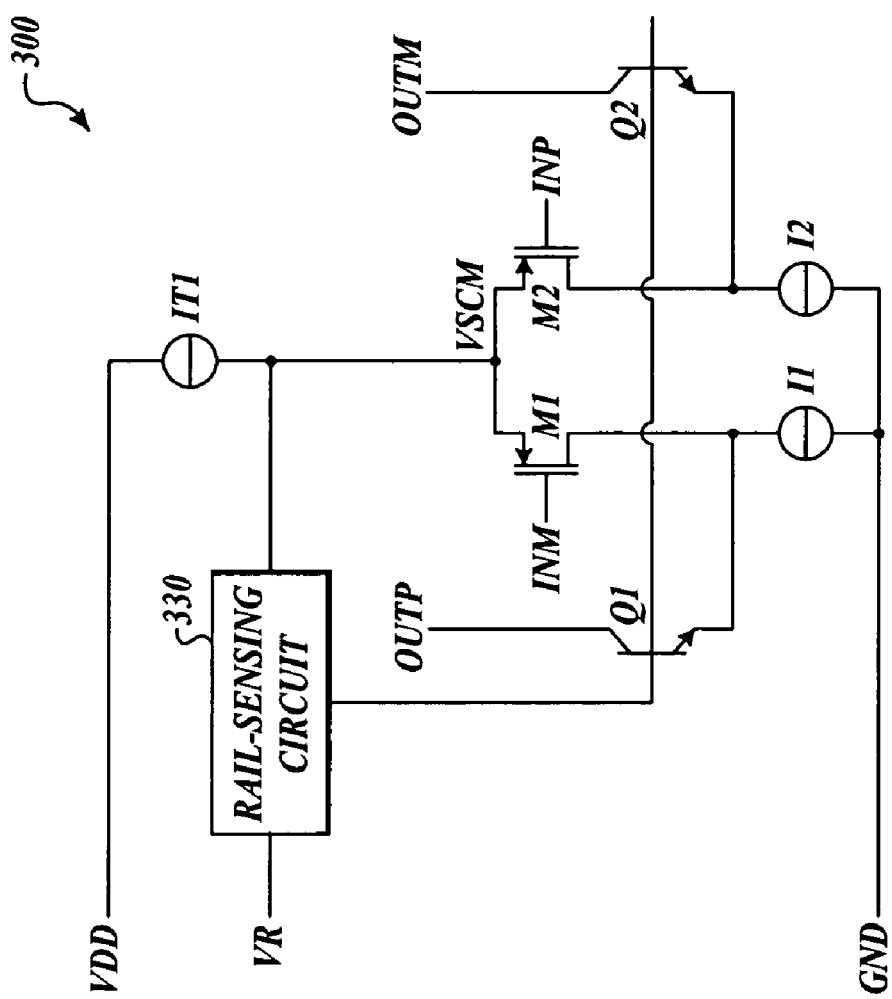
FIG. 3 shows a block diagram of an embodiment of the circuit of FIG. 1 that includes a rail-sensing circuit.

FIG. 3 shows a block diagram of an embodiment of circuit 300, which includes a rail-sensing circuit. Components in circuit 300 may operate in a similar manner as similarly-named component in circuit 100 of FIG. 1, and may operate in a different manner in some ways. Circuit 300 further includes rail-sensing circuit 330.

Rail-sensing circuit 330 is coupled between the source of transistor M1 and the base of transistor Q1. In an embodiment in which transistors M1 and M2 are p-type transistors, rail-sensing circuit 330 is arranged to sense the negative rail (e.g. GND). In an embodiment in which transistors M1 and M2 are n-type transistors, rail-sensing circuit 330 is arranged to sense the positive rail (e.g. VDD).

In one embodiment, rail-sensing circuit 330 is a ground-sensing circuit that operates as a maximum selector circuit. In this embodiment, transistors M1 and M2 are p-type transistors. Also, rail-sensing circuit 330 is arranged to compare voltage $V_{SCM}$ with reference voltage Vr. Further, in this embodiment, rail-sensing circuit 330 is arranged to provide a signal based on the greater of voltage $V_{SCM}$ and reference voltage Vr to the base of transistor Q1.

In another embodiment, rail-sensing circuit 330 is a VDD-sensing circuit that operates as a minimum selector circuit. In this embodiments, transistors M1 and M2 are n-type transistors. Also, rail-sensing circuit 330 is arranged to compare voltage $V_{SCM}$ with reference voltage Vr. Further, in this embodiment, rail-sensing circuit 330 is arranged to provide a signal based on the lesser of voltage VSCM and reference voltage Vr to the base of transistor Q1.

Figure 4:
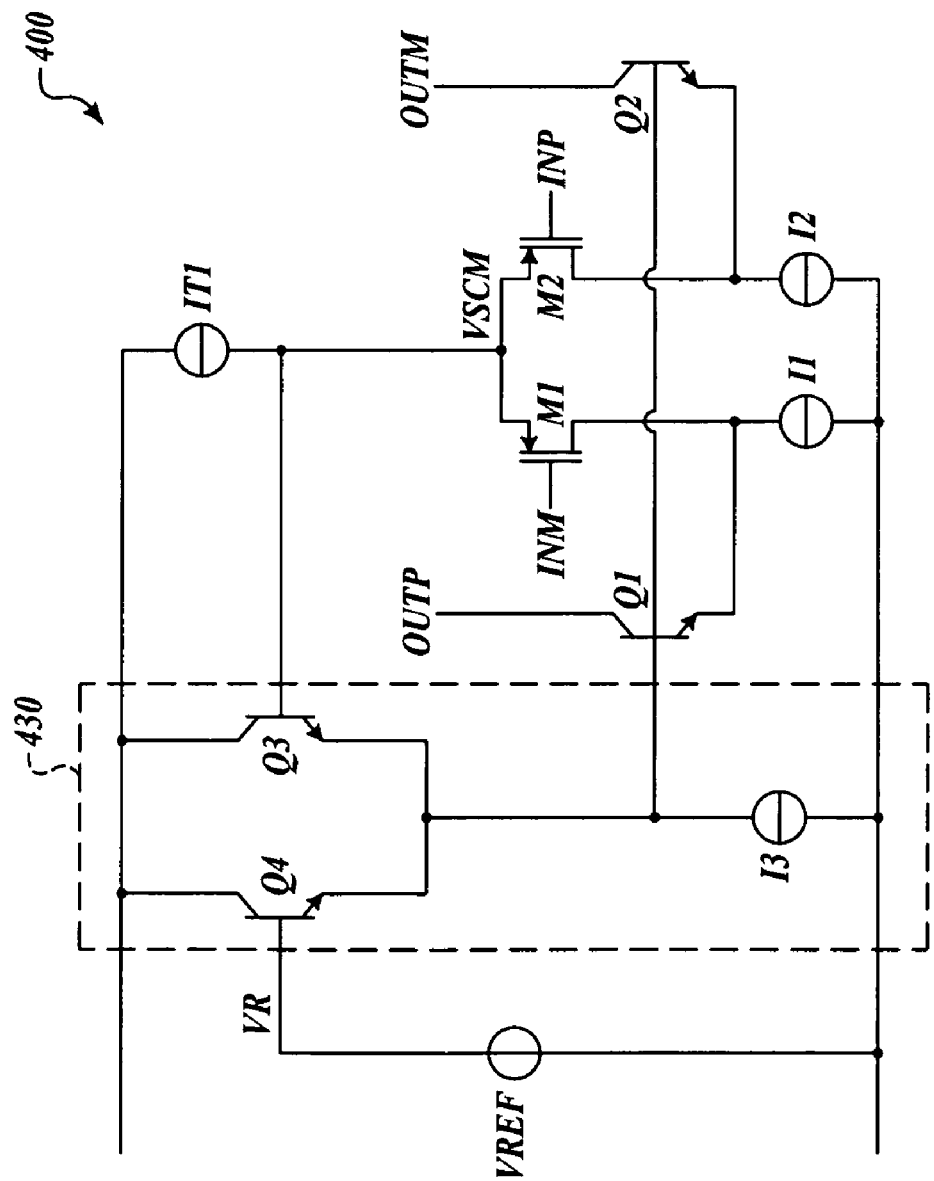
FIG. 4 illustrates a schematic diagram of an embodiment of the circuit of FIG. 3 in which an embodiment of the rail-sensing circuit of FIG. 3 is schematically illustrated.

FIG. 4 illustrates a schematic diagram of an embodiment of circuit 400, in which an embodiment of a rail-sensing circuit 430 is schematically illustrated. Components in circuit 400 may operate in a similar manner as similarly-named component in circuit 300 of FIG. 3, and may operate in a different manner in some ways. In circuit 400, rail-sensing circuit 400 includes transistors Q3 and Q4, current source circuit I3, and reference voltage circuit Vref.

Reference voltage circuit Vref is configured to provide reference voltage Vr.

Also, circuit 400 is arranged such that, at high input common mode voltages, the drains of transistors M1 and M2 are biased at the input common mode voltage, plus the threshold voltage of transistors M1 and M2, minus two base-emitter voltages. Transistors M1 and M2 are arranged to employ a drain-to-source voltage equal to two base-emitter voltages. At high common mode voltages, the operation of circuit 400 is substantially similar to the embodiment of circuit 100 in which transistors M1 and M2 operate with a drain-to-source voltage substantially equal to one base-emitter voltage.

However, for very low input common mode voltages, rail-sensing circuit 430 may be arranged to force the voltage at the emitters of Q3 and Q4 to be substantially equal to Vr−Vbe. This in turn forces the voltage at the drains of the transistors M1 and M2 to be substantially equal to Vr−2*Vbe. In one embodiment, Vr is substantially equal to 2*Vbe+Vcsat, where Vcsat is the saturation voltage of current source circuits I1 and I2. Accordingly, in this embodiment, the voltage at the drains of the transistors M1 and M2 and across current source circuits I1 and I2 can be clamped to Vcsat at low input common mode voltages. This may ensure operation of the input stage even at low input common mode voltages, and potentially a few hundred millivolts below the negative rail.

Voltage reference circuit Vref may be implemented by diodes and resistors operating at a bias current. In one embodiment, voltage reference circuit Vref includes a current source circuit that is configured to provide the bias current, a resistor that is arranged to provide a voltage of approximately Vcsat in response to the bias current, and two transistor arranged as diodes, all arranged such that Vr is substantially equal to 2*Vbe+Vcsat.

Although rail-sensing circuit 430 is shown as a maximum selector, in another embodiment, rail-sensing circuit 430 is a minimum selector. In this embodiment, transistors M1 and M2 are n-type transistors, the collectors of transistors Q3 and Q4 are coupled to the negative rail rather than the positive rail, and reference voltage circuit Vref and current source circuit I3 are coupled to the positive rail rather than the negative rail.

Figure 5:
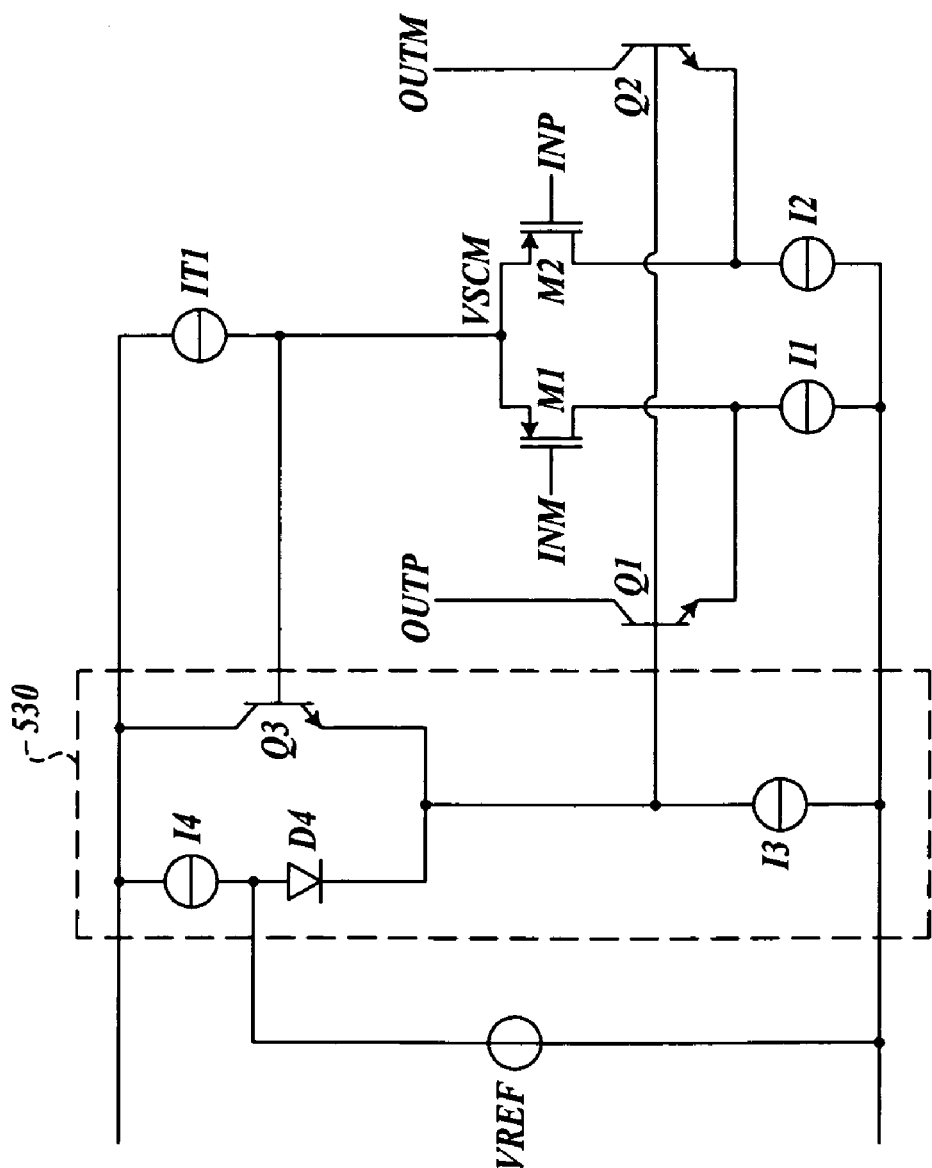
FIG. 5 illustrates a schematic diagram of another embodiment of the circuit of FIG. 3 in which another embodiment of the rail-sensing circuit of FIG. 3 is schematically illustrated.

FIG. 5 illustrates a schematic diagram of an embodiment of circuit 500, where an embodiment of a rail-sensing circuit 530 is schematically illustrated. Components in circuit 500 may operate in a similar manner as similarly-named component in circuit 300 of FIG. 3, and may operate in a different manner in some ways. In circuit 500, rail-sensing circuit 530 includes transistor Q3, diode D4, voltage reference circuit Vref, and current source circuits I3 and I4.

Reference voltage circuit Vref is configured to provide reference voltage Vr. Reference voltage circuit Vref may be implemented by diodes and resistors operating at a certain bias current, as described above with regard to FIG. 4. The impedance associated with reference voltage circuit Vref is sufficiently low that diode D4 overdrives transistor Q3 when diode D4 is forward-biased. Also, current source circuit I4 is arranged to provide a greater current than current source circuit I3, to ensure that diode circuit D4 overdrives transistor Q3 if diode D4 is forward-biased.

Additionally, rail-sensing circuit 530 is arranged such that diode D4 is forward-biased if Vr is greater than $V_{SCM}$, and reverse-biased otherwise. Also, transistor Q3 may be arranged to provide, at the base of transistor Q1, a voltage substantially equal to $V_{SCM}$ minus the base-emitter voltage of transistor Q3 if diode D4 is reverse-biased. Further, diode D4 may be arranged to provide, and the base of transistor Q1, a voltage of Vr minus the forward voltage drop associated with diode D4 if diode D4 is forward-biased.

Figure 6:
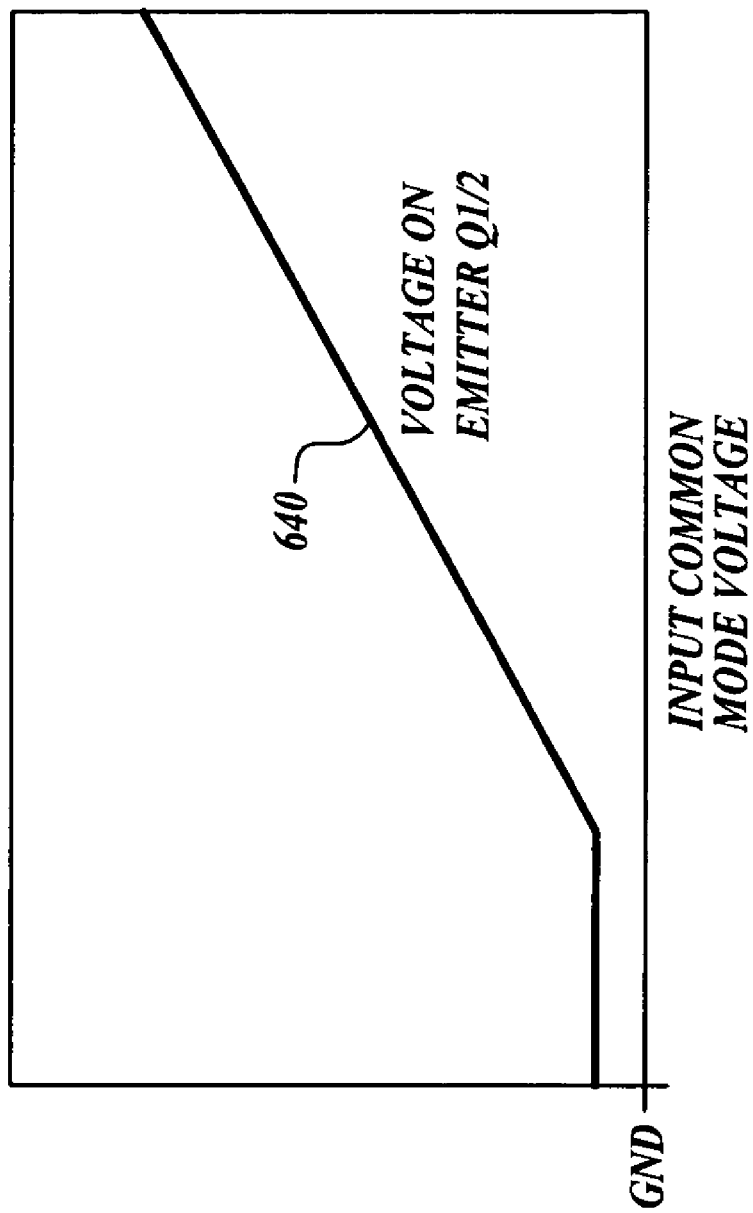
FIG. 6 shows a graph of a waveform of an embodiment of the emitter voltage of transistor Q1 (and Q2) of FIG. 5 over input common mode voltage.

FIG. 6 shows a graph of waveform 640 of an embodiment of the emitter voltage of transistor Q1 (and Q2) of FIG. 5 over input common mode voltage. As shown by waveform 640, the emitter voltage of transistor Q1 tracks the input common mode voltage for high common mode voltage. However, the emitter voltage of transistor Q1 (and Q2) is clamped if the input common mode voltage is relatively near GND. This may ensure that current source circuits I1 and I2 have enough headroom to operate properly.

Figure 7:
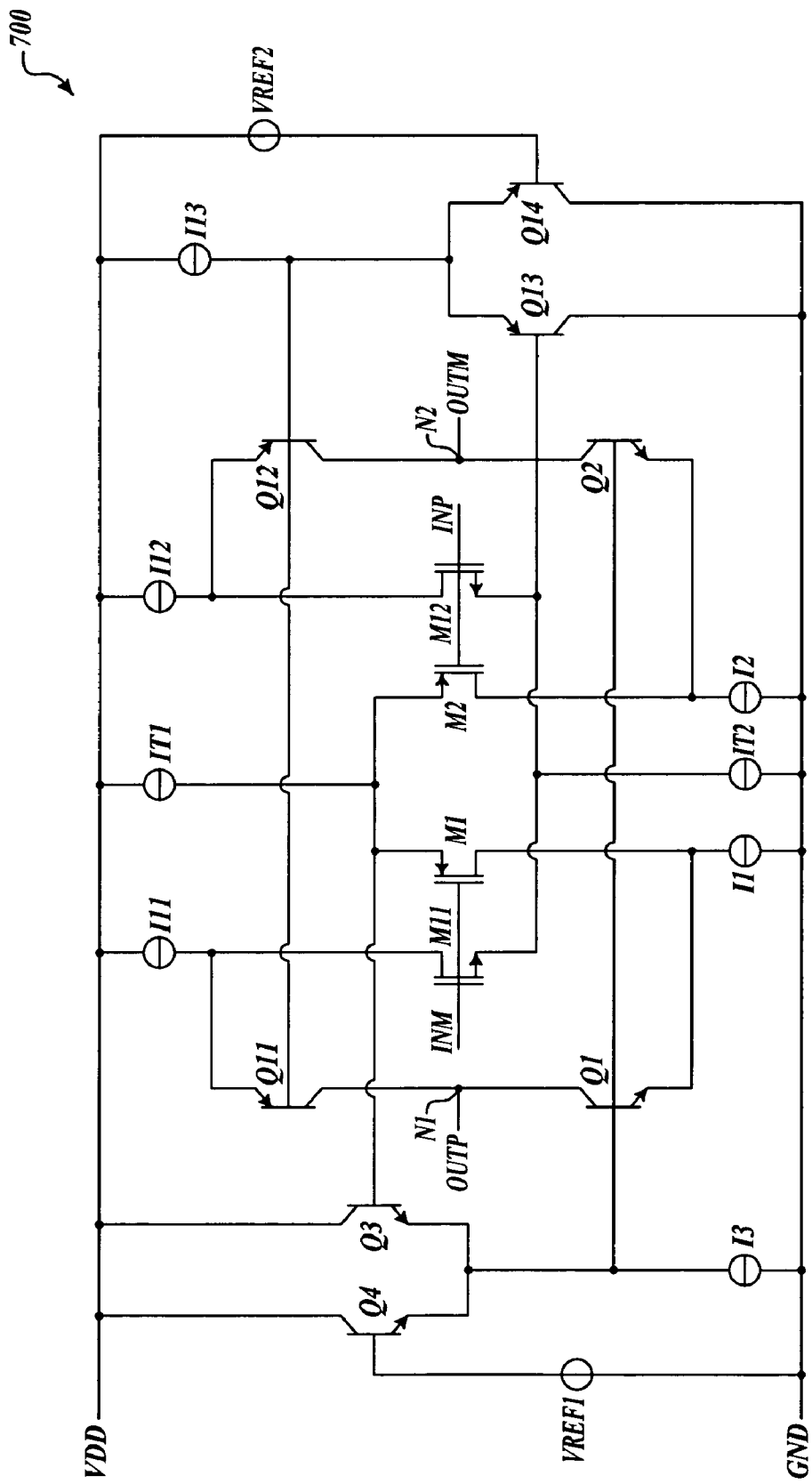
FIG. 7 illustrates a schematic diagram of a rail-to-rail embodiment of the circuit of FIG. 1.

FIG. 7 illustrates a schematic diagram of an embodiment of circuit 700, which is an embodiment of a rail-to-rail circuit. Components in circuit 700 may operate in a similar manner as similarly-named components in circuit 100 of FIG. 1, and may operate in a different manner in some ways.

Circuit 700 includes two complementary stages coupled together to form a rail-to-rail input stage. In one embodiment, the circuit illustrated in circuit 100 may be combined with a complementary version of the circuit illustrated in circuit 100. In other embodiments, the circuits illustrated in circuit 200, 300, 400, and/or 500 may be combined with a complementary version of the circuit, coupled together to form a rail-to-rail input stage. The complementary version of circuit 100, 200, 300, 400, and/or 500 may operate in a substantially similar manner to circuit 100, 200, 300, 400, and/or 500 respectively, except that p-type transistors may be replaced with n-type transistors and vice versa, and that connections with the positive rail may be replaced with connections to the negative rail, and vice versa. Further, the complementary version of circuit 100, 200, 300, 400, and/or 500 is arranged to receive signal IN.

In circuit 700, the collector of transistor Q11 and the collector of transistor Q1 are both coupled to output node N1, and the collector of transistor Q12 and the collector of transistor Q2 are both coupled to output node N2. Signal OutP is provided at node N1, and signal OutM is provided at node N2.

Figure 8:
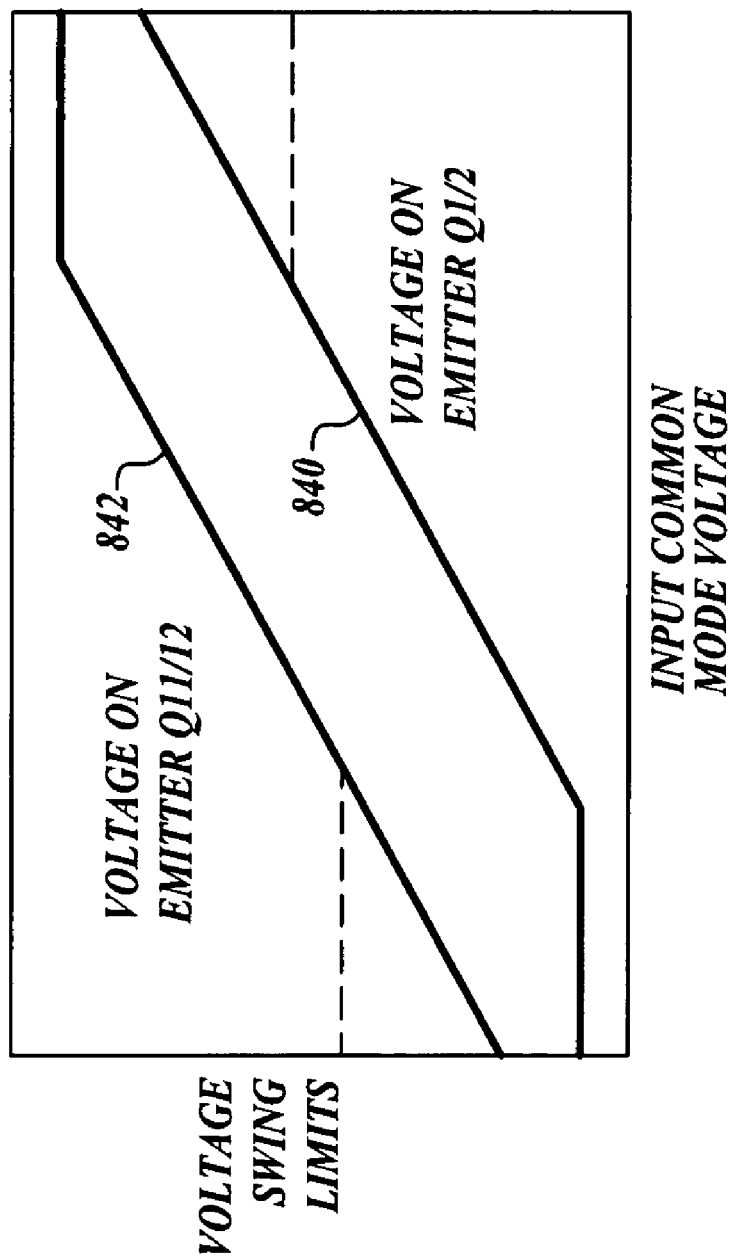
FIG. 8 shows a graph of waveforms of an embodiment of the emitter voltage of transistor Q1 (and Q2) of FIG. 7 and a waveform of an embodiment of the emitter voltage of transistor Q11 (and Q12) over input common mode voltage.

FIG. 8 shows a graph of waveform 840 of an embodiment of the emitter voltage of transistor Q1 (and Q2) of FIG. 7 and waveform 842 of an embodiment of the emitter voltage of transistor Q11 (and Q12) of FIG. 7 over input common mode voltages. FIGS. 8 shows embodiments of signals in which a rail-sensing circuit and a complement of the rail-sensing circuit are both included in circuit 700.

As shown in FIG. 8, circuit 700 may have limited and common mode dependent voltage swing on the output nodes N1 and N2. The output voltage swing on nodes N1 and N2 may be limited on the bottom by the voltage on the emitters of Q1 and Q2 and on the top by the voltage on the emitters of Q11 and Q12. FIG. 8 shows these limits as a function of the input common mode voltages. The lower limit may substantially equal Vcm+Vth−2*Vbe at high input common mode voltage and may be clamped to Vref−2*Vbe at low input common mode voltages. The high limit may substantially equal Vcm−Vth+2*Vbe at low input common mode voltage and may be clamped to VDD−Vref+2*Vbe at high input common mode voltage. If Vth is approximately equal to Vbe, the differential voltage swing available on the output nodes may be limited to 2*Vbe at intermediate input common mode voltages and even less for input common mode voltages near the supply rails.

In one embodiment, performance may be improved by clamping the voltages on transistors Q1 and Q2 as illustrated by the dashed lines in FIG. 8. In this embodiment, common mode feedback with an input common mode voltage dependent reference voltage is employed the output nodes to make this voltage track the limits illustrated in FIG. 8.

Figure 9:
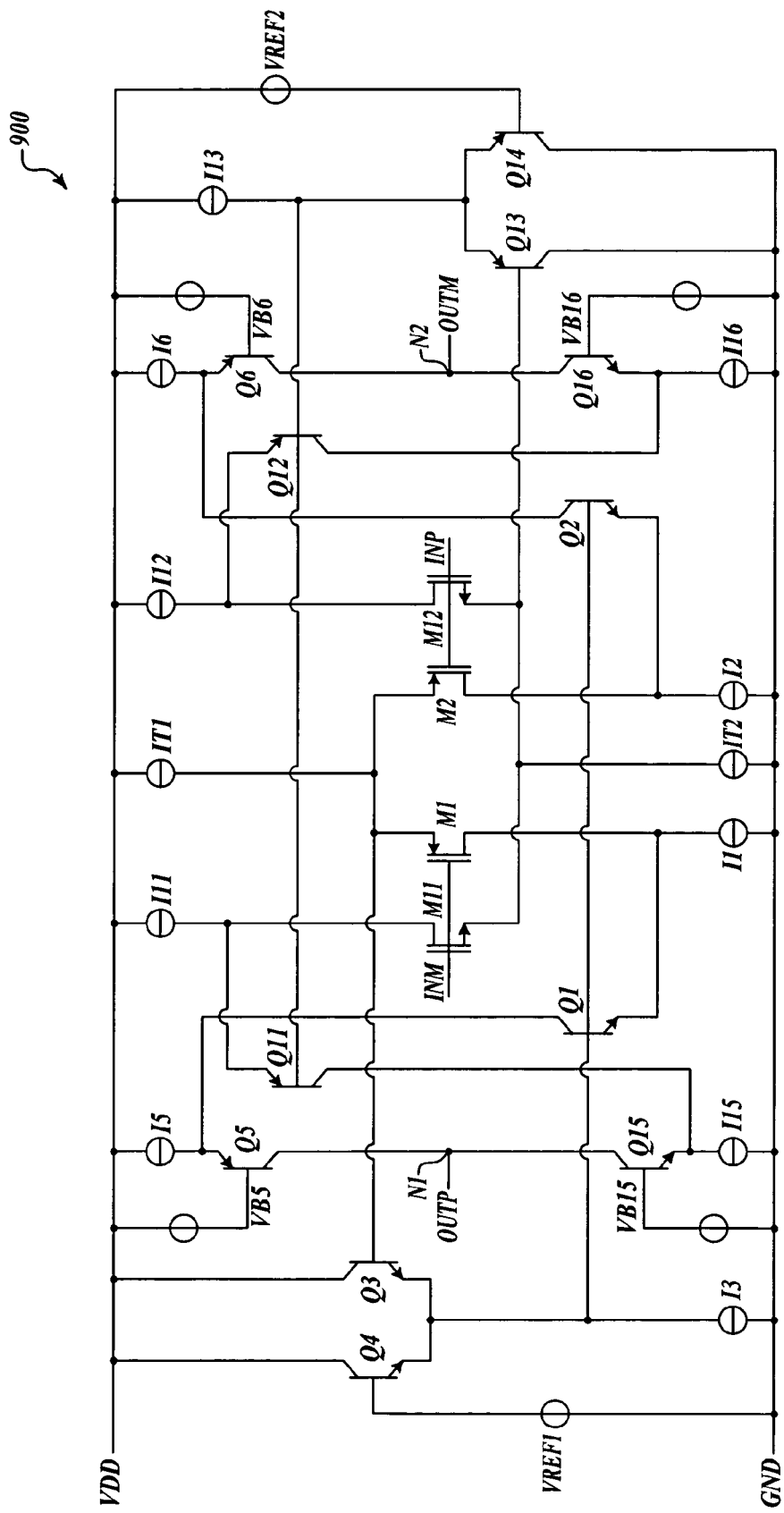
FIG. 9 illustrates a schematic diagram of another rail-to-rail embodiment of the circuit of FIG. 1, in accordance with aspects of the invention.

FIG. 9 illustrates a schematic diagram of an embodiment of circuit 900, which is another embodiment of a rail-to-rail circuit. Components in circuit 900 may operate in a similar manner as similarly-named components in circuit 700, and may operate in a different manner in some ways. In circuit 900, the collector of transistor Q11 is not directly connected to the collector of transistor Q1, and the collector transistors Q12 is not directly connected to the collector of transistor Q2. Instead, circuit 900 includes an additional folded cascode stage that includes components such as transistors Q5, Q15, Q6, and Q16.

Transistors Q1, Q11, Q2, and Q12 are each arranged as folded cascode transistors, and each includes a collector that is coupled to an emitter of transistors Q5, Q15, Q6, and Q16, respectively. Transistors Q5, Q15, Q6, and Q16 each are arranged as folded cascode transistors that are each arranged to receive a cascode bias voltage VB5, VB15, VB6, and VB16 respectively at its respective base.

The collectors of transistors Q5 and Q15 are each coupled to output node N1, and the collectors of transistors Q6 and Q16 are each coupled to output node N2. Circuit 900 is arranged such that the voltage swing available on the output nodes of this input stage spans almost the entire supply voltage range.

Circuit 900 may be dimensioned in such a way that the noise is limited by transistors M1 and M2. In one embodiment, the current source circuits in circuit 900 are each implemented with degenerated bipolar current source circuits that include a resistor and a bipolar transistor. In this embodiment, the degeneration resistors in current source circuit I15, I15, I6, and I16 are larger than the degeneration resistors of current source circuit I1, I11, I6 and I16, so that the noise contribution of the second folded cascode stages is small compared to the noise contribution of the first folded cascode stages. This is possible because the first folded cascode stage has to operate close to the supply rails to allow rail-to-rail input stage operation. For the second folded cascode stage, the designer has more freedom and the current source circuits can be given a larger compliance voltage.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for receiving high common mode voltage signals with low-voltage devices, the circuit comprising:
   a first transconductance stage that includes an output, a differential input, and a source, wherein the first transconductance stage is arranged to provide a first current at the output of the first transconductance stage in response to a differential input signal that is received at the differential input, and wherein the first transconductance stage is arranged to provide, at the source of the first transconductance stage, a first common mode signal that is associated with an input common mode voltage of the differential input signal;
   a load circuit that is arranged to provide a first voltage from the first current; and
   a first cascode transistor that includes a first cascode base, a first cascode emitter, and a first cascode collector, wherein the first cascode emitter is coupled to the output of the first transconductance stage, the first cascode base is arranged to receive a cascode base signal such that a voltage at the output of the first transconductance stage substantially tracks the input common mode voltage to prevent a breakdown condition from occurring if a closed loop operation is being employed; the cascode base signal is based, in part, on the first common mode signal; and wherein an output voltage is based, at least in part, on a voltage that is associated with the first cascode collector.

2. The circuit of claim 1, wherein the first cascode transistor is a bipolar junction transistor, the first transconductance stage includes a differential pair that includes two input transistors, and wherein each of the two input transistors is one of a field effect transistor and a superbeta transistor.

3. The circuit of claim 1, wherein the first transconductance stage is arranged to receive the differential input signal such that the differential input signal includes a relatively high common voltage range, the first transconductance stage includes a plurality of transistors that each have a gate-oxide breakdown voltage that is significantly lower than the relatively high common mode voltage range, and wherein the breakdown condition includes: exceeding the gate-oxide breakdown voltage of at least one of the plurality of transistors in the first transconductance stage.

4. The circuit of claim 1, further comprising a level-shift circuit that is coupled between the source of the first transconductance stage and the first cascode base.

5. The circuit of claim 1, further comprising:
   a reference voltage circuit that is arranged to provide a reference voltage; and
   a selector circuit that is arranged determine if the first common mode signal is greater than the reference voltage, and further arranged to select and provide a signal based on one of the reference voltage and the first common mode signal as the cascode base signal based on the determination.

6. The circuit of claim 5, wherein the selector circuit includes:
   a first selector transistor that includes a first selector base and a first selector emitter, wherein the first selector base is coupled to the source of the first transconductance stage, and wherein the first selector emitter is coupled to the first cascode base;
   a diode that includes an anode and a cathode, wherein the cathode is coupled to the first selector emitter;
   a selector tail current source that is coupled to the first selector emitter, wherein the selector tail source current is arranged to provide a selector tail current; and
   an overdrive current source circuit that is coupled to the anode, wherein the overdrive current source is arranged to provide an overdrive current such that the overdrive current is greater than the selector tail current.

7. The circuit of claim 1, further comprising:
   a second transconductance stage that is complementary to the first transconductance stage, wherein the second transconductance stage includes a differential input, an output and a source, wherein the second transconductance stage is arranged to receive the differential input signal at the differential input of the second transconductance stage; to provide a second current at the output of the second transconductance stage in response to the differential input signal; and to provide, at the source of the second transconductance stage, a second common mode signal that is associated with the input common mode voltage of the differential input signal;

a second load circuit that is arranged to provide a second voltage from the second current; and a first complementary cascode transistor that includes a first complementary cascode base, a first complementary cascode emitter, and a first complementary cascode collector, wherein the first complementary cascode base is arranged to receive a complementary cascode base signal that is based, in part, on the second common mode signal.

8. The circuit of claim 7, further comprising:

a second cascode transistor that includes a second cascode base, a second cascode emitter, and a second cascode collector, wherein the second cascode base is arranged to receive a cascode bias voltage, and wherein the second cascode emitter is coupled to the first cascode collector; and a second complementary cascode transistor that includes a second complementary cascode base, a second complementary cascode emitter, and a second complementary cascode collector, wherein the second complementary cascode base is arranged to receive another cascode bias voltage, the second complementary cascode emitter is coupled to the first complementary cascode collector, wherein the second complementary cascode collector is coupled to the second cascode collector.

9. A circuit for receiving high common mode voltage signals with low-voltage devices, the circuit comprising:

a first transconductance stage, including:
a first transistor that includes a first gate, a first source, and a first drain; and
a second transistor that includes a second gate, a second source, and a second drain, wherein the second source is coupled to the first source; and a first cascode transistor that includes a first cascode base, a first cascode emitter, and a first cascode collector, wherein the first cascode base is coupled to the first source, and wherein the first cascode emitter is coupled to the first drain.

10. The circuit of claim 9, further comprising:

another cascode transistor that includes another cascode base, another cascode emitter, and another cascode collector, wherein the other cascode base is coupled to the first cascode base, and wherein the other cascode emitter is coupled to the second drain.

11. The circuit of claim 9, wherein the first cascode transistor is a bipolar junction transistor.

12. The circuit of claim 9, wherein the first transistor is one of a field effect transistor and a superbeta bipolar junction transistor, and wherein the second transistor is one of another field effect transistor and another superbeta bipolar junction transistor.

13. The circuit of claim 9, wherein the first transconductance stage further includes a current source circuit that is coupled to the source of the first transistor.

14. The circuit of claim 9, further comprising a load circuit that is coupled to the first drain, wherein the load circuit includes a current source circuit.

15. The circuit of claim 9, wherein the first transconductance stage receives an input signal at the first and second gates, the input signal includes a common mode voltage that is greater than 5 volts, and wherein the first and second transistors operate at an operating voltage that is less than or equal to five volts.

16. The circuit of claim 9, further comprising:

a first diode that is coupled between the first gate and the second gate; and a second diode that is coupled between the first gate and the second gate, antiparallel to the first diode.

17. The circuit of claim 9, further comprising a level-shift circuit that is coupled between the first source and the first cascode base.

18. The circuit of claim 9, further comprising a rail-sensing circuit that is coupled between the first source and the first cascode base.

19. The circuit of claim 18, wherein the rail-sensing circuit includes:

a reference voltage circuit that is arranged to provide a reference voltage; and one of a maximum selector circuit and a minimum selector circuit, wherein the one of the maximum selector circuit and the minimum selector circuit includes a first input that is coupled to the reference voltage, a second input that is coupled to the first source, and an output that is coupled to the first cascode base.

20. The circuit of claim 19, wherein the one of the maximum selector circuit and the minimum selector circuit includes:

a first selector transistor that includes a first selector base and a first selector emitter, wherein the first selector base is coupled to the first source, and the first selector emitter is coupled to the first cascode base; and a second selector transistor that includes a second selector base and a second selector emitter, wherein the second selector base is coupled to the reference voltage circuit, and wherein the second selector emitter is coupled to the first selector emitter.

21. The circuit of claim 19, wherein the one of the maximum selector circuit and the minimum selector circuit includes:

a first selector transistor that includes a first selector base and a first selector emitter, wherein the first selector base is coupled to the first source, and the first selector emitter is coupled to the first base;

a diode that includes an anode and a cathode, wherein the cathode is coupled to the first selector emitter;

a selector tail current source that is coupled to the first selector emitter, wherein the selector tail source current is arranged to provide a selector tail current; and an overdrive current source circuit that is coupled to the anode, wherein the overdrive current source is arranged to provide an overdrive current such that the overdrive current is greater than the selector tail current.

22. The circuit of claim 9, further including:

a second transconductance stage that includes:
a first complementary transistor that includes a first complementary gate, a first complementary source, and a first complementary drain, wherein the first complementary gate is coupled to the first gate; and
a second complementary transistor that includes a second complementary gate, a second complementary source, and a second complementary drain, wherein the second complementary source is coupled to the first complementary source, and wherein the second complementary gate is coupled to the second gate; and a first complementary cascode transistor that includes a first complementary cascode base, a first complementary cascode emitter, and a first complementary cascode collector, wherein the first complementary cascode base is coupled to the first complementary source, and wherein the first complementary cascode emitter is coupled to the first complementary drain.

23. The circuit of claim 22, wherein the first complementary cascode collector is coupled to the first cascode collector.

24. The circuit of claim 22, furthering comprising:
a second cascode transistor that includes a second cascode base, a second cascode emitter, and a second cascode collector, wherein the second cascode base is arranged to receive a cascode bias voltage, and wherein the second cascode emitter is coupled to the first cascode collector; and
a second complementary cascode transistor that includes a second complementary cascode base, a second complementary cascode emitter, and a second complementary cascode collector, wherein the second complementary cascode base is arranged to receive another cascode bias voltage, the second complementary cascode emitter is coupled to the first complementary cascode collector, and wherein the second complementary cascode collector is coupled to the second cascode collector.

25. The circuit of claim 24, further including:
a first degenerated bipolar current source that is coupled to the second cascode emitter, wherein the first degenerated bipolar current source include a first current source transistor and a first current source resistor, and wherein the first current source resistor includes a first resistance; and
a second degenerated bipolar current source that is coupled to the second complimentary cascode emitter, wherein the second degenerated bipolar current source include a second current source transistor and a second current source resistor, the second current source resistor includes a second resistance, and wherein the second resistance is larger than the first resistance.

26. The circuit of claim 24, further comprising:
a rail-sensing circuit, including:
a reference voltage circuit that is arranged to provide a reference voltage; and
a maximum selector circuit including a first input that is coupled to the reference voltage circuit, a second input that is coupled to the first source, and an output that is coupled to the first cascode base; and
another rail-sensing circuit that includes:
another reference voltage circuit that is arranged to provide another reference voltage; and
a minimum selector circuit including a first input that is coupled to the other reference voltage circuit, a second input that is coupled to the first complementary source, and an output that is coupled to the first complementary cascode base.

27. A circuit for receiving high common mode voltage signals with low-voltage devices, the circuit comprising:
a means for providing a first current in response to a differential input signal;
a means for providing a common mode signal that is associated with an input common mode voltage of the differential input signal;
a means for providing a first voltage from the first current;
a means for providing the first voltage to an emitter of a cascode transistor; and
a means for providing a signal that is based, at least in part, on the common mode signal, to the base of the cascode transistor.

* * * * *

UNITED STATES PATENT AND TRADEMARK OFFICE
CERTIFICATE OF CORRECTION

| | | |
|---|---|---|
| PATENT NO. | : 6,998,907 B1 | |
| APPLICATION NO. | : 10/847103 | |
| DATED | : February 14, 2006 | |
| INVENTOR(S) | : Willem Johannes Kindt et al. | |

It is certified that error appears in the above-identified patent and that said Letters Patent is hereby corrected as shown below:

<u>Title page,</u>
Item [56], References Cited, U.S. PATENT DOCUMENTS, after "4,897,612" delete "A" and insert -- B1 --.

<u>Column 1,</u>
Line 37, delete "level shift" and insert -- level-shift --.

<u>Column 2,</u>
Line 57, delete "Kirchhoffs" and insert -- Kirchhoff's --.

<u>Column 3,</u>
Line 28, delete "VSCM" and insert -- $V_{SCM}$ --.

<u>Column 4,</u>
Line 60, delete "VSCM" and insert -- $V_{SCM}$ --.

<u>Column 5,</u>
Lines 2, 44 and 62, delete "13" and insert -- I3 --.
Line 60, delete "14" and insert -- I4--.

<u>Column 6,</u>
Line 46, delete "FIGS. 8" and insert -- FIG. 8 --.

UNITED STATES PATENT AND TRADEMARK OFFICE
CERTIFICATE OF CORRECTION

PATENT NO. : 6,998,907 B1
APPLICATION NO. : 10/847103
DATED : February 14, 2006
INVENTOR(S) : Willem Johannes Kindt et al.

It is certified that error appears in the above-identified patent and that said Letters Patent is hereby corrected as shown below:

<u>Column 11,</u>
Line 7, delete "furthering" and insert -- further --.
Line 32, delete "complimentary" and insert -- complementary --.

Signed and Sealed this

Eleventh Day of July, 2006

JON W. DUDAS
*Director of the United States Patent and Trademark Office*